United States Patent
Kanno et al.

[11] Patent Number: 6,048,409
[45] Date of Patent: *Apr. 11, 2000

[54] WASHING APPARATUS AND WASHING METHOD

[75] Inventors: Itaru Kanno; Toshiaki Ohmori; Hiroshi Tanaka; Nobuaki Doi, all of Hyogo, Japan

[73] Assignees: Mitsubishi Denki Kabushiki Kaisha, Tokyo; Ryoden Semiconductor System Engineering Corporation, Hyogo, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/917,103

[22] Filed: Aug. 25, 1997

Related U.S. Application Data

[62] Division of application No. 08/908,001, Aug. 11, 1997, Pat. No. 5,934,566, which is a continuation of application No. 08/560,915, Nov. 20, 1995, abandoned.

[30] Foreign Application Priority Data

May 26, 1995 [JP] Japan ................... 7-127984

[51] Int. Cl.⁷ ...................................................... B08B 3/02
[52] U.S. Cl. ................... 134/34; 134/37; 134/2; 134/1.3; 134/102.1; 134/902
[58] Field of Search ............................... 134/32, 33, 34, 134/37, 902, 3, 2, 1.3, 102.1

[56] References Cited

U.S. PATENT DOCUMENTS

| | | |
|---|---|---|
| 3,050,262 | 8/1962 | Curtis . |
| 4,027,686 | 6/1977 | Shortes et al. .............................. 134/33 |
| 4,787,404 | 11/1988 | Klosterman et al. . |
| 4,809,911 | 3/1989 | Ryan . |
| 4,982,753 | 1/1991 | Grebinski, Jr. et al. ............. 134/902 X |
| 5,181,985 | 1/1993 | Lampert et al. ..................... 134/28 X |
| 5,351,360 | 10/1994 | Suzuki et al. . |
| 5,364,474 | 11/1994 | Williford, Jr. .............................. 134/32 |
| 5,456,758 | 10/1995 | Menon . |
| 5,555,902 | 9/1996 | Menon . |
| 5,873,380 | 2/1999 | Kanno .................................. 134/102.1 |

FOREIGN PATENT DOCUMENTS

| | | |
|---|---|---|
| 90 13 724 U1 | 3/1992 | Germany . |
| 690 08 695 T2 | 9/1994 | Germany . |
| 63-110639 | 5/1988 | Japan . |
| 2-280330 | 11/1990 | Japan . |
| 3-186369 | 8/1991 | Japan . |

OTHER PUBLICATIONS

Handbook of Semiconductor Wafer Cleaning Technology, Noyes Publications, pp. 137–141, 1993.

*Primary Examiner*—Randy Gulakowski
*Assistant Examiner*—Alexander Markoff
*Attorney, Agent, or Firm*—McDermott, Will & Emery

[57] ABSTRACT

The present invention is directed to providing an apparatus which is improved so as to remove a contamination on a substrate efficiently. This apparatus includes a jet nozzle jetting out droplets toward a substrate. A liquid supply device and a gas supply device are connected to the jet nozzle. A mixing device mixing a liquid and a gas supplied to the jet nozzle and changing the liquid into the droplets is provided in the jet nozzle.

7 Claims, 8 Drawing Sheets

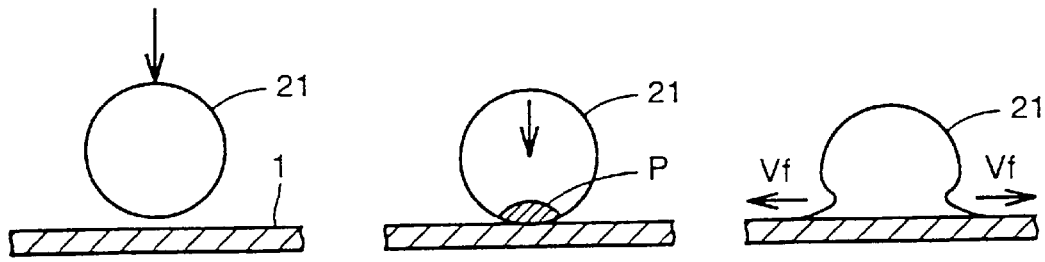
FIG. 6(a)   FIG. 6(b)   FIG. 6(c)
FIG. 7
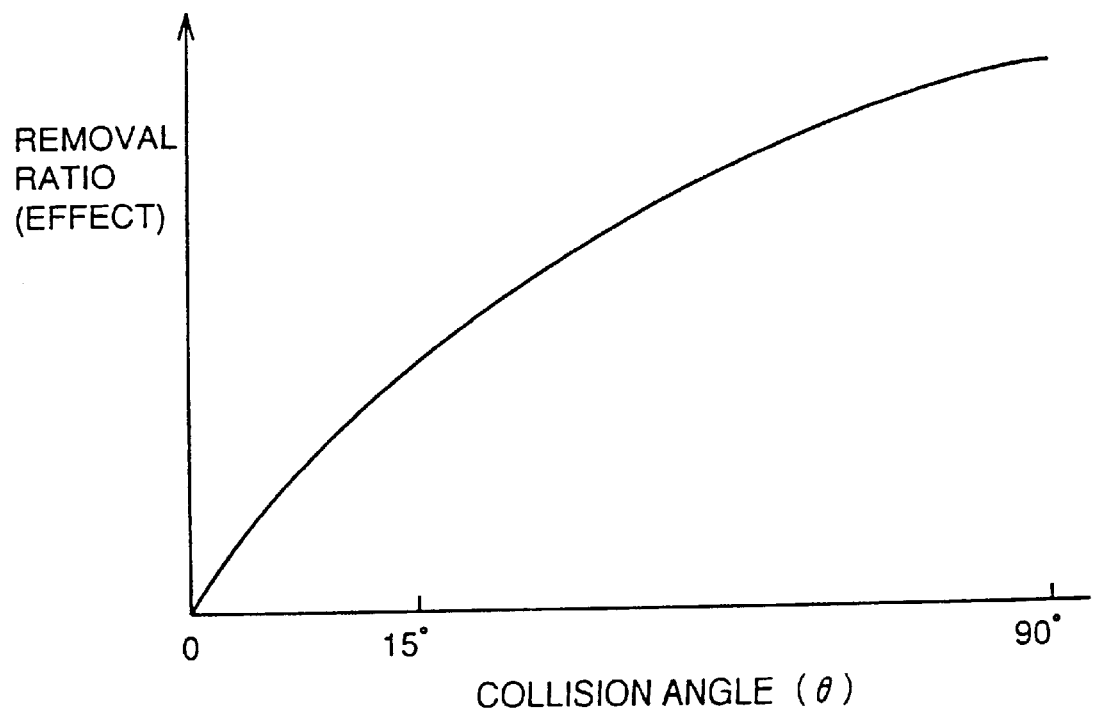

WASHING APPARATUS AND WASHING METHOD

This application is a division of application Ser. No. 08/908,001 filed Aug. 11, 1997, now U.S. Pat. No. 5,934,566 which is a continuation of application Ser. No. 08/560,915 filed Nov. 20, 1995 now abandoned.

BACKGROUND OF THE INVENTION

1. Field of the Invention

The present invention generally relates to washing apparatus, and more particularly, to a washing apparatus removing a contamination adhering onto a substrate. The present invention further relates to a washing method for removing a contamination adhering onto a substrate.

2. Description of the Background Art

When a film is formed on a wafer with a CVD method or a sputtering method, a particulate contamination adheres onto the surface of the wafer. Further, a resist residue sometimes adheres onto the surface of the wafer. As a method of removing these contaminations, a high pressure jet water washing method, a mega sonic running water washing method, an ice scrubber washing method and the like have been proposed.

FIG. 15 is a diagram showing a concept of an apparatus implementing a conventional washing method which is called high pressure jet water washing.

This apparatus includes a liquid pressurizer 3, a jet nozzle 4, and a stage 2 supporting and rotating a wafer 1. In this washing method, a liquid such as pure water compressed by liquid pressurizer 3 is continuously jetted out at a high speed toward the surface of wafer 1 by jet nozzle 4. The liquid jetted out at a high speed collides with the surface of wafer 1, whereby a contamination particle adhering onto the surface of wafer 1 is removed, and the surface is washed. Wafer 1 is rotated by rotating stage 2, and jet nozzle 4 is moved, so that the entire surface of wafer 1 is washed.

Referring to FIG. 16, the liquid jetted out at a high speed from jet nozzle 4 is formed into a liquid column 20 to collide with the surface of wafer 1 in this method.

This method has a problem as follows. Since a large amount of liquid such as pure water collides with the surface of wafer 1 at a high speed, static electricity is generated on the surface of wafer 1, which in turn damages devices formed on the surface of wafer 1. In order to reduce the damage, a method of mixing a $CO_2$ gas or the like into the pure water to decrease the specific resistance of the pure water and to reduce static electricity generated on the surface of wafer 1 may be employed. However, this is not a perfect solution. Further, the method shown in FIG. 15 encounters another problem of not removing a small foreign matter (particle) of 1 μm or less sufficiently.

FIG. 17 is a schematic diagram showing another conventional washing method which is called mega sonic running water washing. This washing apparatus includes stage 2 rotating wafer 1, and a nozzle 5 applying a high frequency of approximately 1.5 MHz to a liquid such as pure water and discharging the same. In this washing method, by vibrating the pure water at the high frequency in the vertical direction by nozzle 5 and jetting out the pure water toward wafer 1, the surface of wafer 1 is washed. This method encounters the following problems.

Similar to the case of the high pressure jet water washing method, a small foreign matter (particle) of 1 μm or less cannot be removed sufficiently with this method. Further, although the washing effect is slightly increased in general by speeding up rotation of stage 2, the washing effect is large in the peripheral portion of wafer 1, while the washing effect is small in the center portion of wafer 1 in this case. Therefore, variation in washing occurs on the surface of wafer 1. Further, this method has a problem of destruction of miniaturized patterns of devices formed on the surface of wafer 1. It is recognized that there is a correlation between destruction of devices and the washing effect. In this washing method, the frequency and output of a high frequency to be applied, the number of rotation of stage 2, and the distance between nozzle 5 and wafer 1 are used as parameters controlling destruction of devices and the washing effect. However, it is difficult to control these parameters because of their small control ranges.

FIG. 18 is a schematic diagram of an apparatus implementing still another conventional washing method which is called ice scrubber washing. This washing apparatus includes an ice hopper 6 generating ice particles. Ice hopper 6 is provided with a supply spray 7 supplying pure water which is a liquid to be frozen to ice hopper 6. A jet nozzle 8 jetting out the ice particles toward wafer 1 is provided at the bottom of ice hopper 6.

Operation will now be described. A liquified gas such as liquid nitrogen is supplied to ice hopper 6. A liquid to be frozen such as pure water is sprayed into ice hopper 6 by supply spray 7. By jetting out the ice particles of several μm to several tens μm generated in ice hopper 6 toward wafer 1 from jet nozzle 8 of a gas ejector type, the surface of wafer 1 is washed. This washing method achieves a higher washing effect as compared with the above described high pressure jet water washing method and mega sonic running water washing method. However, the speed at which the ice particles are jetted out, which determines the washing force, cannot exceed the sonic velocity, because jet nozzle 8 of a gas ejector type is used. Therefore, there is a limitation in the washing force. Further, usage of a large amount of liquid nitrogen in order to form ice particles increases the initial cost of equipment for supplying liquid nitrogen, and the running cost is also high.

The above problem of destruction of devices can be suppressed by controlling the speed at which the ice particles are jetted out. However, in view of the constraints of assembling the apparatus, the speed at which the ice particles are jetted out can be currently controlled only within a range of 100 to 330 m/sec, and the control width is narrow. Therefore, destruction of devices cannot be suppressed completely.

Such problems in washing as described above also occur in the case where a contamination adhering not only onto the semiconductor wafer but also onto a liquid crystal substrate and a substrate of a photomask or the like is removed.

SUMMARY OF THE INVENTION

One object of the present invention is to provide a washing apparatus which removes a contamination adhering onto the surface of a substrate.

Another object of the present invention is to provide a washing apparatus which is improved so as to remove a small foreign matter of 1 μm or less adhering onto a substrate.

Still another object of the present invention is to provide a washing apparatus whose running cost is low.

A further object of the present invention is to provide a washing apparatus which is improved so as to remove a contamination particle adhering onto a substrate without damaging the surface of the substrate.

A further object of the present invention is to provide a washing method for removing a contamination particle adhering onto a substrate.

A further object of the present invention is to provide a washing method which is improved so as to remove a contamination particle adhering onto a substrate without damaging the surface of the substrate.

The washing apparatus according to one aspect of the present invention includes an apparatus removing a contamination adhering onto the surface of a substrate. This washing apparatus includes a jet nozzle jetting out a droplet toward the substrate. A liquid supply device supplying a liquid to the jet nozzle is connected to the jet nozzle. A gas supply device supplying a gas to the jet nozzle is connected to the jet nozzle. A mixing device mixing the liquid and the gas supplied to the jet nozzle and changing the liquid into a droplet is provided in the jet nozzle.

The washing apparatus according to another aspect of the present invention includes a washing apparatus removing a contamination adhering onto the surface of a substrate. This washing apparatus includes a chemicals supply nozzle supplying chemicals toward the substrate, and a jet nozzle jetting out a droplet of pure water toward the substrate. A pure water supply device supplying the pure water to the jet nozzle is connected to the jet nozzle. A gas supply device supplying a gas to the jet nozzle is connected to the jet nozzle. A mixing device mixing the pure water and the gas supplied to the jet nozzle and changing the pure water into a droplet is provided in the jet nozzle.

The washing apparatus according to still another aspect of the present invention includes a washing apparatus removing a contamination adhering onto the surface of a substrate. The washing apparatus includes a jet nozzle jetting out a droplet toward the substrate. A pure water supply device having a first open/close valve for supplying pure water to the jet nozzle is connected to the jet nozzle. A chemicals supply device having a second open/close valve for supplying chemicals to the jet nozzle is connected to the jet nozzle. A gas supply device supplying a gas to the jet nozzle is connected to the jet nozzle. A mixing device mixing the pure water or the chemicals and the gas and changing the pure water or the chemicals into a droplet is provided in the jet nozzle.

The washing method according to a further aspect of the present invention includes a method of removing a contamination adhering onto the surface of a substrate. This method includes the steps of directing an outlet of a jet nozzle toward the substrate, supplying a liquid to the jet nozzle, supplying a gas to the jet nozzle, and mixing the liquid with the gas in the jet nozzle and jetting out an obtained droplet from the outlet.

The washing method according to a further aspect of the present invention includes the steps of washing the surface of a substrate with a washing solution, and jetting out a droplet of pure water onto the surface of the substrate.

The washing method according to a further aspect of the present invention includes the step of jetting out a droplet of a washing solution onto a substrate.

The washing method according to a further aspect of the present invention includes the steps of first jetting out a droplet of a washing solution onto a substrate, and jetting out a droplet of pure water onto the substrate.

The washing apparatus according to the one aspect of the present invention includes the mixing device mixing the liquid and the gas supplied to the jet nozzle and changing the liquid into a droplet provided in the jet nozzle. Therefore, the droplet is easily formed.

The washing apparatus according to the another aspect of the present invention includes the chemicals supply nozzle supplying chemicals toward the substrate. Therefore, the chemicals can be supplied onto the surface of the substrate.

The washing apparatus according to the still another aspect of the present invention includes the pure water supply device having the first open/close valve and the chemicals supply device having the second open/close valve provided in the jet nozzle. Therefore, by switching the valves, a droplet of the chemicals and a droplet of the pure water can be selectively formed.

In the washing method according to the further aspect of the present invention, the contamination on the substrate is removed by the droplet.

In the washing method according to the further aspect of the present invention, the surface of the substrate is first washed with the washing solution. Therefore, the bond between the substrate and the contamination is loosened.

In the washing method according to the further aspect of the present invention, the washing solution is jetted out onto the substrate in the form of a droplet. Therefore, the contamination on the substrate is effectively removed.

In the washing method according to the further aspect of the present invention, the droplet of the pure water is jetted out onto the substrate after the droplet of the washing solution is jetted out onto the substrate. Therefore, the contamination on the substrate is removed effectively.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6(a)–6(c) are diagrams for explaining the basic concept of the present invention.

FIG. 7 is a graph showing the relationship between a droplet collision angle and the removal ratio.

DESCRIPTION OF THE PREFERRED EMBODIMENTS

Embodiments of the present invention will be described hereinafter with reference to the drawings.

Embodiment 1

Figure 1:
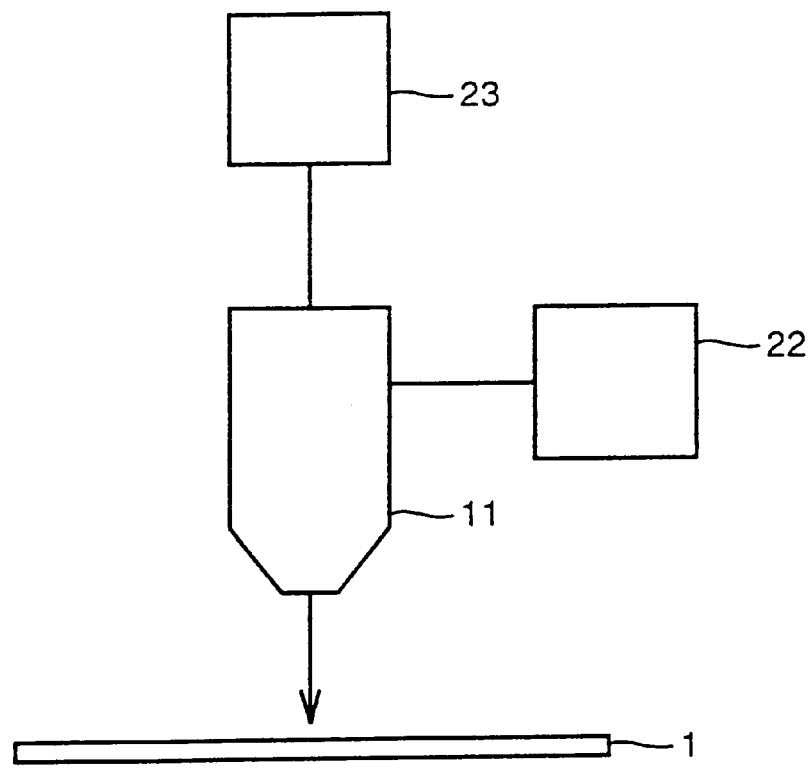
FIG. 1 is a diagram showing a concept of a washing apparatus according to Embodiment 1.

FIG. 1 is a diagram showing a concept of a wafer washing apparatus, for example, according to Embodiment 1. This apparatus removes a contamination adhering onto the surface of semiconductor wafer 1. This apparatus includes a jet nozzle 11 jetting out a droplet toward semiconductor wafer 1. To jet nozzle 11, a liquid supply device 23 supplying a liquid to jet nozzle 11 is connected. To jet nozzle 11, a gas supply device 22 supplying a gas to jet nozzle 21 is further connected.

Figure 2:
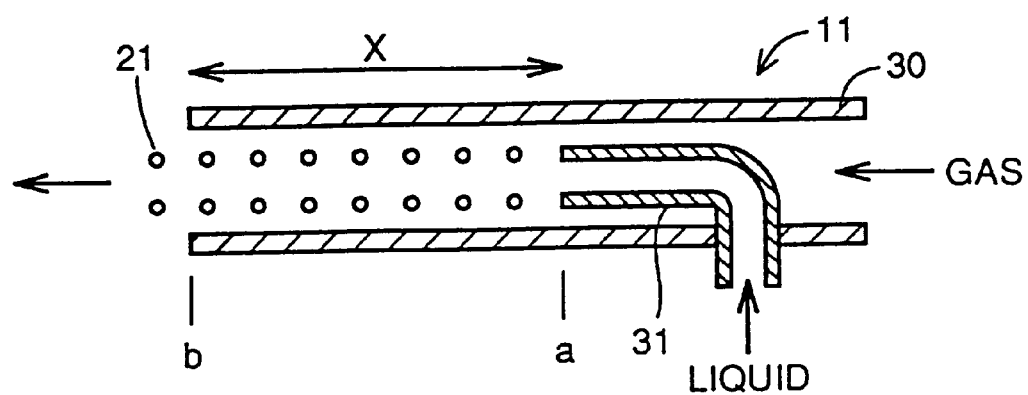
FIG. 2 is a sectional view of a jet nozzle used in the washing apparatus according to Embodiment 1.

FIG. 2 is a sectional view of jet nozzle 11. Jet nozzle 11 includes a first flow line 30 through which the gas passes. Jet nozzle 11 further includes a second flow line 31 whose tip portion extends from the outside of first flow line 30 through a sidewall of first flow line 30 into first flow line 30 and through which the liquid passes. The tip portion of second flow line 31 extends in the same direction as first flow line 30.

Returning to FIG. 1, liquid supply device 23 includes a pressurized tank, a regulator or the like (not shown) which controls the supply pressure and the supply amount of the liquid to jet nozzle 11. The supply pressure of the liquid is preferably controlled to be within a range of 1 to 10 kg/cm$^2$.

Figure 3:
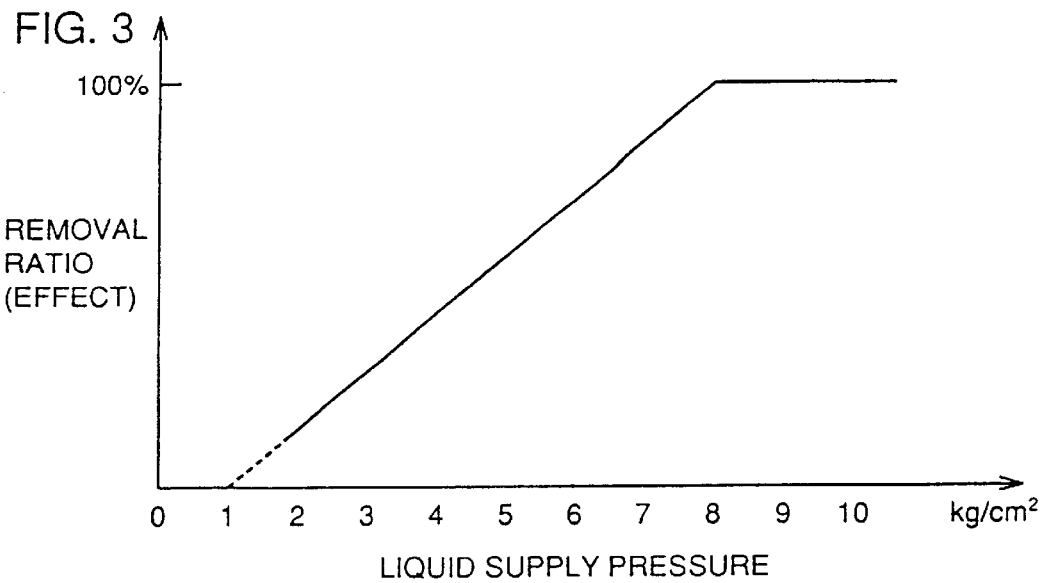
FIG. 3 is a graph showing the relationship between a liquid supply pressure and a contamination removal ratio.

FIG. 3 is a graph showing the relationship between the liquid supply pressure and the contamination removal ratio. Referring to FIG. 3, when the liquid supply pressure is controlled to be within a range of 2 to 4 kg/cm$^2$, the contamination can be removed without damaging the surface of the semiconductor wafer. When the liquid supply pressure is controlled to be within a range of 4 to 8 kg/cm$^2$, the removal ratio is improved. When the liquid supply pressure is controlled to be 8 kg/cm$^2$, the removal ratio attains approximately 100%. Even if the supply pressure is further increased, the removal ratio does not change.

Gas supply device 22 also includes a regulator or the like (not shown), which controls the supply pressure and the supply amount of the gas. The gas supply pressure is preferably controlled to be within a range of 1 to 10 kg/cm$^2$.

Referring to FIG. 2, the gas and the liquid are mixed in jet nozzle 11, and the liquid is changed into a particulate droplet 21 to be jetted out from the tip of first flow line 30 together with a flow of the gas. Droplet 21 generated at the tip of second flow line 31 is accelerated between (a) and (b) in the figure by the flow of the gas in first flow line 30 and jetted out from the tip of first flow line 30. The distance x between the tip (a) of second flow line 31 and the tip (b) of first flow line 30 must be 70 mm or more, and preferably 100 mm or more. When the distance x is less than 70 mm, the speed at which droplets 21 are jetted out is decreased, and the washing effect is reduced.

The speed at which droplets 21 are jetted out is determined by the liquid supply pressure (supply amount), the gas supply pressure (supply amount), the distance x between (a) and (b), and the inner diameter of first flow line 30. Generally, the distance x between (a) and (b) and the inner diameter of first flow line 30 are fixed, and the liquid supply amount is set to approximately 1/100 the gas supply amount. Therefore, the speed at which droplets 21 are jetted out is mainly controlled by the gas supply pressure (and the supply amount). More specifically, the speed at which droplets 21 are jetted out can be controlled to be within a range of 1 m/sec to the sonic velocity (330 m/sec).

Figure 4:
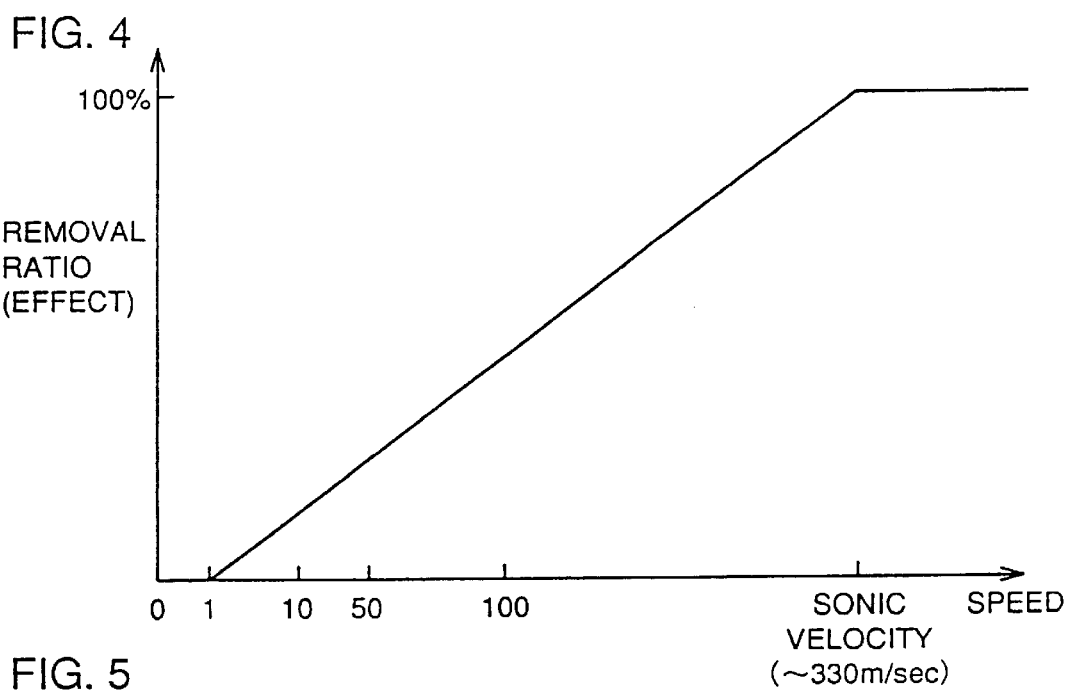
FIG. 4 is a graph showing the relationship between a droplet jet-out speed and the contamination removal ratio.

FIG. 4 is a graph showing the relationship between the speed at which droplets 21 are jetted out and the contamination removal ratio. When the speed at which droplets are jetted out is controlled to be within a range of 10 m/sec to 100 m/sec, the damage of the surface of the semiconductor wafer is reduced. On the other hand, when the speed is controlled to be 100 m/sec or more, the contamination removal ratio is increased.

The grain size of droplet 21 is determined by the liquid supply pressure (supply amount), the gas supply pressure (supply amount), the inner diameter of first flow line 30, and the inner diameter of second flow line 31. Since the inner diameter of second flow line 31 and the inner diameter of first flow line 30 are generally fixed, the grain size of droplet 21 is controlled by the liquid and gas supply pressures (supply amounts). When the liquid supply amount is decreased and the gas supply amount is increased, the grain size of droplet 21 is decreased. On the other hand, when the liquid supply amount is increased and the gas supply amount is decreased, the grain size of droplet 21 is increased. More specifically, the grain size of droplet 21 can be controlled to be within a range of 0.01 $\mu$m to 1000 $\mu$m. By adjusting the grain size of droplet 21, a small foreign matter of 1 $\mu$m or less adhering onto the substrate can be removed.

Figure 5:
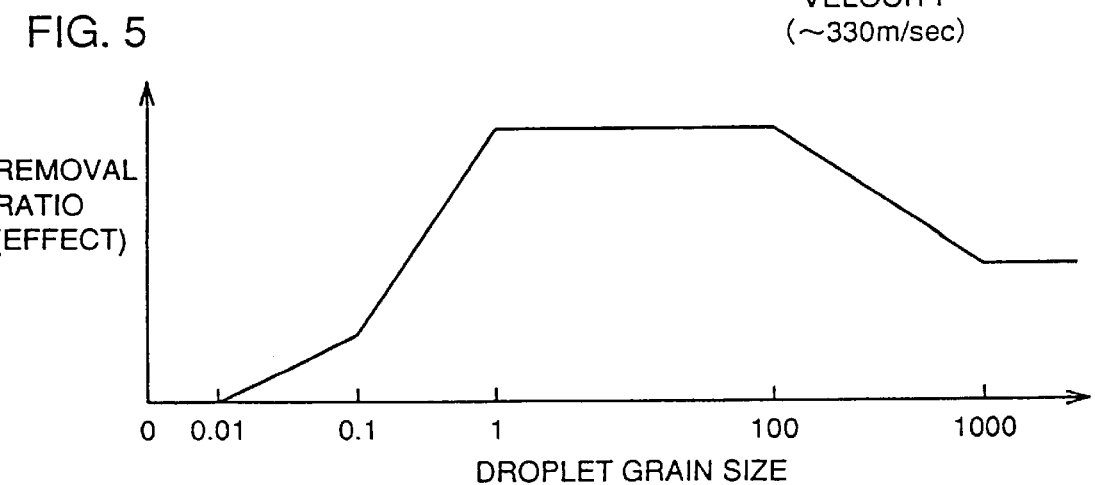
FIG. 5 is a graph showing the relationship between a droplet grain size and the contamination removal ratio.

FIG. 5 is a graph showing the relationship between the grain size of a droplet and the contamination removal ratio. When the grain size of droplet 21 is within a range of 0.01 $\mu$m to 0.1 $\mu$m, the removal ratio is slightly increased as the grain size of droplet 21 is increased. When the grain size of droplet 21 is within a range of 0.1 $\mu$m to 1 $\mu$m, the removal ratio is significantly increased as the grain size of droplet 21 is increased. When the grain size of droplet 21 is within a range of 1 $\mu$m to 100 $\mu$m, the removal ratio (100%) does not change no matter how the grain size of droplet 21 is increased. When the grain size of droplet 21 is within a range of 100 $\mu$m to 1000 $\mu$m, the removal ratio is decreased as the grain size of droplet 21 is increased.

As described above, by changing the speed at which droplet 21 is jetted out and the grain size of droplet 21, the washing effect (removal ratio) and the damage to devices can be controlled.

As described above, an external force (removability) which acts on a foreign matter (particle) on the semiconductor wafer is changed by a collision speed of the droplet. The same force acts on the device pattern formed on the semiconductor wafer. Therefore, when the collision speed of droplet 21 is large, the device pattern may be sometimes destroyed. Therefore, it is necessary to control the speed at which the droplets are jetted out within a range not damaging the devices. Further, even if the grain size of the droplet is changed, the absolute value of the removability which acts on the foreign matter (particle) does not change. However, the area of the particle with which the droplet collides is changed (which has an influence on the washing effect). Consider the case where the liquid supply amount is constant. When the grain size of the droplet is decreased, the number of droplets is increased in inverse proportion to the cube of the grain size. On the other hand, the area of the foreign matter with which one droplet collides is decreased in inverse proportion to the square of the grain size. As a result, the total area where the droplets collide is increased, thereby improving the washing effect. However, when a foreign matter to be removed is large in size, for example, when a foreign matter to be removed is a spherical foreign matter having a diameter of 10 $\mu$m, the removing effect is hardly recognized with a droplet of a grain size of 10 μm or less. In this case, a large droplet having a diameter of approximately 100 μm must be used. Therefore, by freely controlling the grain size of a droplet depending on the size of a foreign matter to be removed, an effective washing can be carried out.

According to this method, a small foreign matter of 1 μm or less adhering onto the substrate can also be removed. Further, according to the method of this embodiment, an expensive material such as liquid nitrogen is not used, leading to a low running cost.

Further, as described above, by changing the grain size of the droplet, the damage to the devices can be controlled. In the case of an interconnection pattern of 1 μm in width, for example, the substrate can be washed without being damaged by using a droplet of a grain size of 1 μm or less.

This embodiment will now be described with specific numerical values.

Referring again to FIG. 2, the outer diameter and the inner diameter of second flow line 31 through which the liquid flows are set to 3.2 mm and 1.8 mm, respectively. The outer diameter and the inner diameter of first flow line 30 through which the gas flows are set to 6.35 mm and 4.35 mm, respectively. The distance x between the tip (a) of second flow line 31 and the tip (b) of first flow line 30 is set to 200 mm. The liquid supply pressure is set to 7 kg/cm², and the liquid supply amount is 2 lit./min. The gas supply amount is set to 300 lit./min. When droplets 21 are formed under such conditions, the grain size of droplet 21 is 1 μm to 100 μm, and the speed at which droplets 21 are jetted out is the sonic velocity (334 m/sec).

The basic concept of the present invention will be described with reference to FIG. 6.

Referring to FIG. 6(a), droplet 21 collides with wafer 1 at a speed of $V_0$. In collision, a pressure called an impact pressure P is generated at a lower portion of droplet 21 with reference to FIG. 6(b). Referring to 6(c), a flow called a radiant flow is generated in the horizontal direction by the impact pressure P.

The impact pressure P is given by the following expression:

$$P = \frac{1}{2}\alpha\rho_L C_L V_0$$

In the above expression, $V_0$ denotes the collision speed, $\rho_L$ denotes the liquid density, $C_L$ denotes the sonic velocity in the liquid, and α denotes a reduction coefficient indicted by the following expression. In the following expression, $\rho_S$ denotes the substrate density and $C_S$ denotes the sonic velocity in the substrate.

$$\alpha = \frac{0.41}{1 + 5.9(\rho_L C_L / \rho_S C_S)}$$

A speed $V_f$ of the radiant flow is given by the following expression:

$$V_f = (\alpha C_L V_0)^{1/2}$$

A foreign matter on wafer 1 is removed by a force given by the radiant flow.

An external force (removability) D acting on a particle on wafer 1 is given by the following expression:

$$D = C_D \frac{\rho_L}{2} V_f^2 \frac{\pi}{4} d^2$$

or $$D = C_D P \frac{\pi}{4} d^2$$

In the expression, $C_D$ denotes a drag coefficient. When Reynold's number R is larger than $10^3$, and the particle is a spherical particle, the drag coefficient $C_D$ is 0.47. In the expression, d denotes the grain size of the particle.

According to the above model, a factor determining the removability includes the collision speed of the droplet, the liquid density, the sonic velocity in the liquid, and the liquid viscosity. Therefore, in order to increase the removability, a liquid material having a larger density and a higher sonic velocity is preferred.

When pure water is used, the density and the sonic velocity can be changed by controlling the temperature of the pure water. By controlling the temperature of the pure water at 4° C. by a temperature control device, the density of the pure water and the sonic velocity in the pure water can be maximized.

Taking electrical damage (static electricity) to devices into consideration, a gas such as $CO_2$ or a surfactant can be mixed into the pure water, so that the specific resistance of the pure water can be avoided. This is also a preferred modification of this embodiment.

Other than the pure water, a liquid or a liquid material (including a gel material) having a larger specific gravity, sonic velocity and viscosity than the pure water can be preferably used.

As a further method of increasing the removability and as a method of controlling pattern damage to devices, a collision angle of droplet 21 is preferably adjusted. By changing the collision angle θ of droplet 21, the impact pressure P is given by the following expression:

$$P = \frac{1}{2}\alpha\rho_L C_L V_0 \sin\theta$$

Therefore, when the collision angle of droplet 21 is increased (the vertical direction to the wafer surface), the impact pressure P is increased, and the external force (removability) D acting on a foreign matter is increased. However, when the external force D is increased, the damage to devices, such as destruction of the device pattern might occur. In order to prevent the damage, the collision angle of droplet 21 is preferably controlled. The collision angle is usually set at 15° to 90°.

FIG. 7 is a graph showing the relationship between the collision angle and the removal ratio.

In the above embodiment, a wafer was illustrated as a substrate. However, the present invention is not limited thereto. The present invention can be applied to the case where a contamination adhering onto a liquid crystal substrate and a substrate of a photomask or the like is removed.

Embodiment 2

Figure 8:
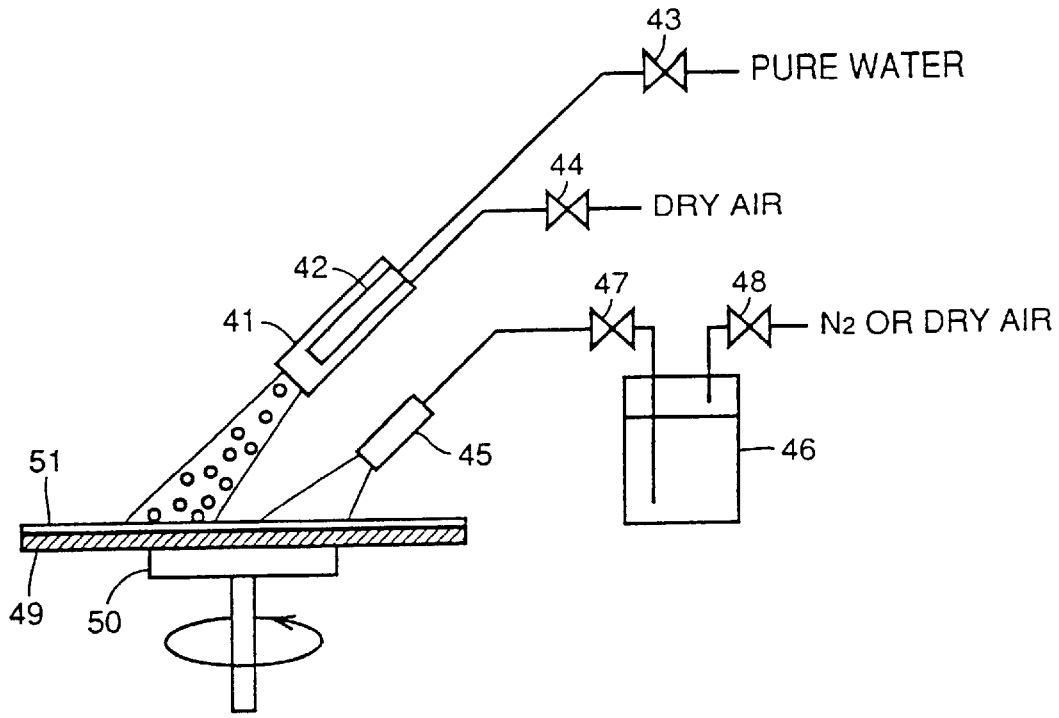
FIGS. 8 to 11 are diagrams showing concepts of washing apparatus according to Embodiment 2 to Embodiment 5, respectively.

FIG. 8 is a diagram showing a concept of a washing apparatus according to Embodiment 2. This apparatus includes a nozzle 41 for jetting out droplets of pure water. An inner tube 42 for supplying the pure water is provided in nozzle 41. A valve 43 is provided in a pure water supply line for supplying the pure water to inner tube 42. A gas supply line supplying a gas (dry air or nitrogen) is connected to nozzle 41. A valve 44 is provided in the gas supply line. This washing apparatus includes a nozzle 45 for spraying a washing solution (acid or alkali chemicals other than pure water). Nozzle 45 is coupled to a tank 46 storing a washing solution by a washing solution supply line. A valve 47 is provided in the washing solution supply line. Tank 46 is provided with a gas line for pressurizing tank 46. A valve 48 is provided in the gas line. A wafer 49 to be washed is mounted on a wafer stage 50. Wafer stage 50 is designed to rotate. A liquid layer 51 is formed on wafer 49.

Operation will now be described. By pressurizing tank 46, the washing solution is sprayed onto the surface of wafer 49 from nozzle 45. In spraying the washing solution, wafer stage 50 is rotated so that the washing solution is uniformly sprayed onto the surface of wafer 49. By the above treatment, an adhesion force between wafer 49 and a contamination (such as a small particle) on the surface is weakened. Then, the pure water and the gas are mixed in nozzle 41, the pure water is jetted out to the surface of wafer 49 in the form of droplet, and the contamination is removed. In this case, the grain size of the droplet, which is determined by the shape of inner tube 42 and the pure water supply pressure, can be controlled to be within a range of 1 $\mu$m to 100 $\mu$m. The speed at which droplets are jetted out can be controlled to be within a range of several m/sec to 330 m/sec by adjusting the gas pressure.

Embodiment 3

Figure 9:
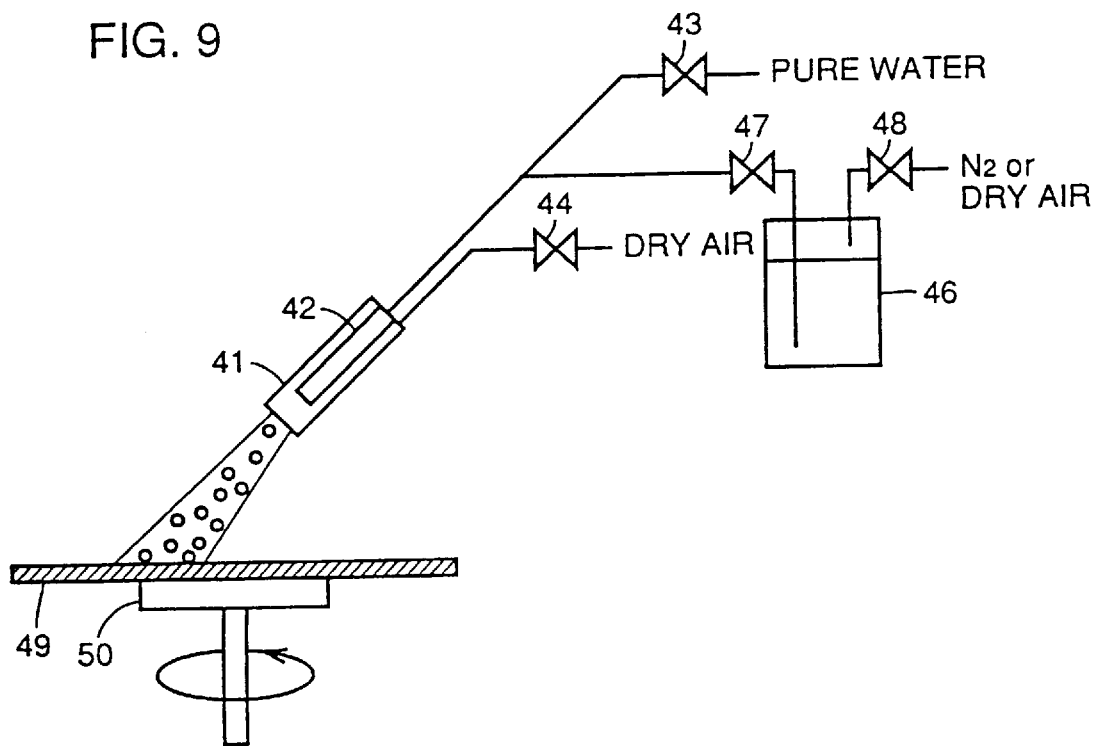

FIG. 9 is a diagram showing a concept of a washing apparatus according to Embodiment 3.

This apparatus includes nozzle 41 for jetting out droplets toward wafer 49. Nozzle 41 is provided with inner tube 42 for supplying a washing solution and pure water. A pure water supply line having valve 43 is connected to inner tube 42. A gas (dry air or nitrogen) supply line having valve 44 is connected to nozzle 41. A washing solution supply line having valve 47 is connected to the pure water supply line. A gas (nitrogen or dry air) supply line having valve 48 is connected to tank 46. Wafer 49 to be washed is mounted on wafer stage 50. Wafer stage 50 is designed to rotate in the direction indicated by an arrow.

Operation will now be described.

By closing valve 43, opening valve 47, opening valve 48, and pressurizing tank 46, droplets of the washing solution are jetted out from nozzle 41 to the surface of wafer 49 together with the gas. At this time, in order to wash the entire surface of wafer 49, wafer stage 50 is rotated, and simultaneously, nozzle 41 is moved in one direction. By the above operation, a contamination (such as a small particle) on the surface of wafer 49 is removed. Then, when valve 47 is closed and valve 43 is opened, the pure water is jetted out to the surface of wafer 49 in the form of droplet from nozzle 41, whereby the contamination is effectively removed.

Embodiment 4

Figure 10:
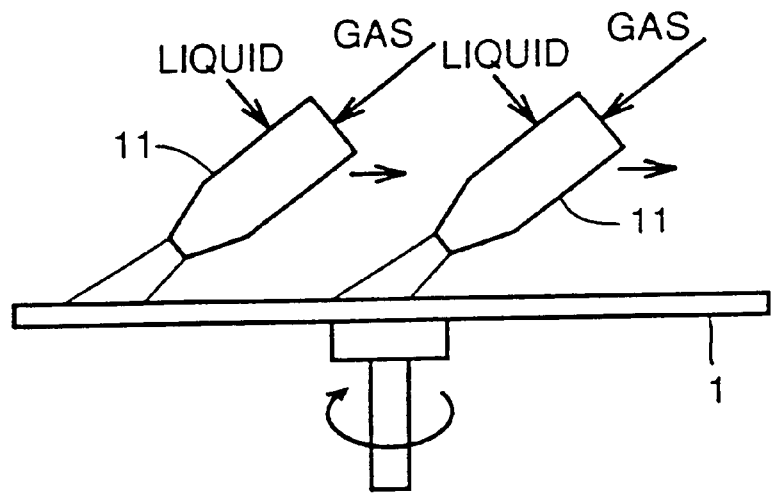

FIG. 10 is a diagram showing a concept of a washing apparatus according to Embodiment 4. Two jet nozzles 11 are provided. These jet nozzles 11 move in the horizontal direction with the same interval kept therebetween. These two jet nozzles 11 are arranged so as not to cross each other. One jet nozzle 11 is arranged so as to jet out droplets to the peripheral portion of substrate 1. The other jet nozzle 11 is arranged so as to jet out droplets to the center portion of substrate 1. Substrate 1 is rotated in the horizontal direction. Jet nozzles 11 each include a liquid supply device and a gas supply device supplying a liquid and a gas to jet nozzle 11. By providing two jet nozzles 11, a time required for removing a foreign matter can be shortened, and foreign matters on the substrate can be removed uniformly.

In the above embodiment, two jet nozzles 11 are provided. However, the similar effect to that of the above embodiment can be expected by arranging a plurality of jet nozzles 11 at regular intervals.

Embodiment 5

Figure 11:
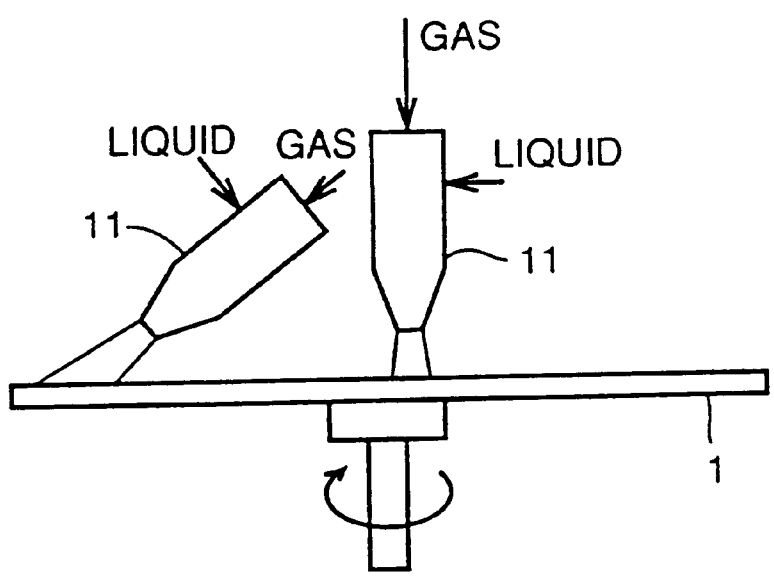

FIG. 11 is a diagram showing a concept of a washing apparatus according to Embodiment 5.

This washing apparatus includes two jet nozzles 11. The respective jet nozzles 11 can change the angles at which droplets are jetted out. Although two jet nozzles 11 are provided in the embodiment shown in FIG. 11, the present invention is not limited thereto. The similar effect to that of this embodiment can be expected by providing a plurality of jet nozzles 11 and designing jet nozzles 11 so that their jet angles can be changed.

Embodiment 6

Figure 12:
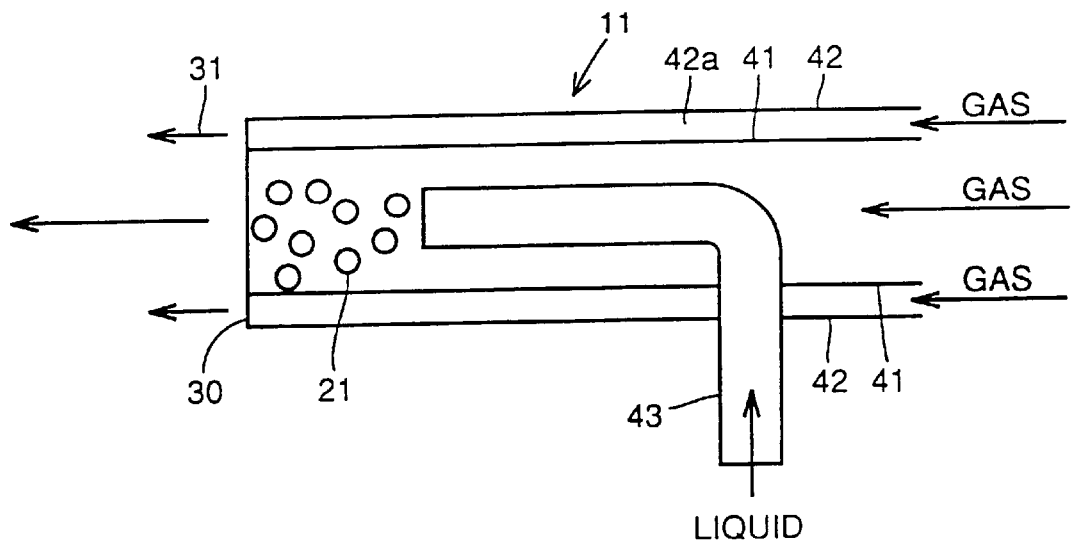
FIG. 12 is a sectional view of another specific example of the jet nozzle forming a droplet.

FIG. 12 is a sectional view of another specific sample of a jet nozzle mixing a liquid and a gas to form droplets. Jet nozzle 11 includes a first flow line 41. Jet nozzle 11 includes a second flow line 42 which is larger than first flow line 41 in diameter and which covers first flow line 41 so as to form a space 42a between second flow line 42 and first flow line 41. Jet nozzle 11 includes a third flow line 43 whose tip extends from the outside of second flow line 42 through sidewalls of second flow line 42 and first flow line 41 into first flow line 41. The liquid passes through third flow line 43. The gas passes through first flow line 41 and space 42a between first flow line 41 and second flow line 42. By the above described structure of jet nozzle 11, droplets 21 are formed. Droplets 21 are covered with a gas 31 through space 42a. Therefore, the speed at which droplets 21 positioned outermost are jetted out is accelerated, which would be decreased by the atmospheric resistance if second flow line 42 were not provided. As a result, variation in the speed among droplets 21 is eliminated, and the removal efficiency of a foreign matter is increased.

Embodiment 7

Figure 13:
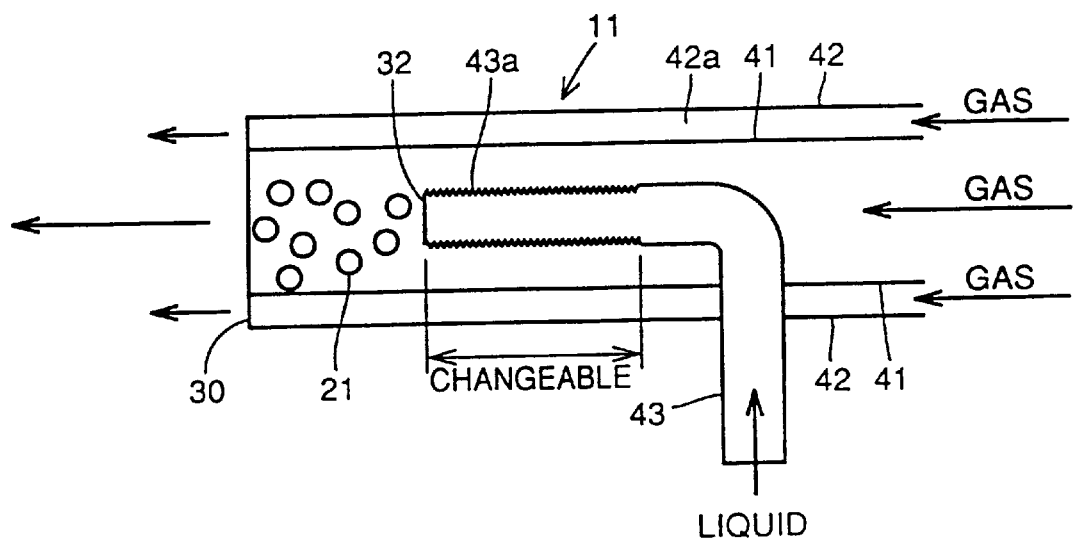
FIG. 13 is a sectional view showing still another specific example of the jet nozzle forming a droplet.

FIG. 13 is a sectional view showing a further embodiment of a jet nozzle used in the present invention. The jet nozzle shown in FIG. 13 is the same as that of FIG. 12 except for the following point. Therefore, the same or corresponding portions are denoted by the same reference characters, and the description thereof will not be repeated.

Unlike the embodiment shown in FIG. 12, a tip portion 43a of third flow line 43 lengthens and shortens in this embodiment. As a result, the position of outlet 32 which is the tip of third flow line 43 can be changed freely. When liquid outlet 32 is close to outlet 30 of second flow line 42, droplets 21 are diffused before they collide with substrate 1, and the speed at which droplets 21 are jetted out is decreased. When the distance between liquid outlet 32 and gas outlet 30 is long, the jet range of droplets 21 is narrowed, and decreasing the jet speed is difficult. Therefore, by structuring jet nozzle 11 as shown in FIG. 13, the jet range and the jet speed of droplets 21 can be selected which are suitable for the state of a foreign matter and the surface of a substrate. The experiment has shown that the optimal distance between liquid outlet 32 and gas outlet 30 is 100 mm to 200 mm.

Embodiment 8

Figure 14:
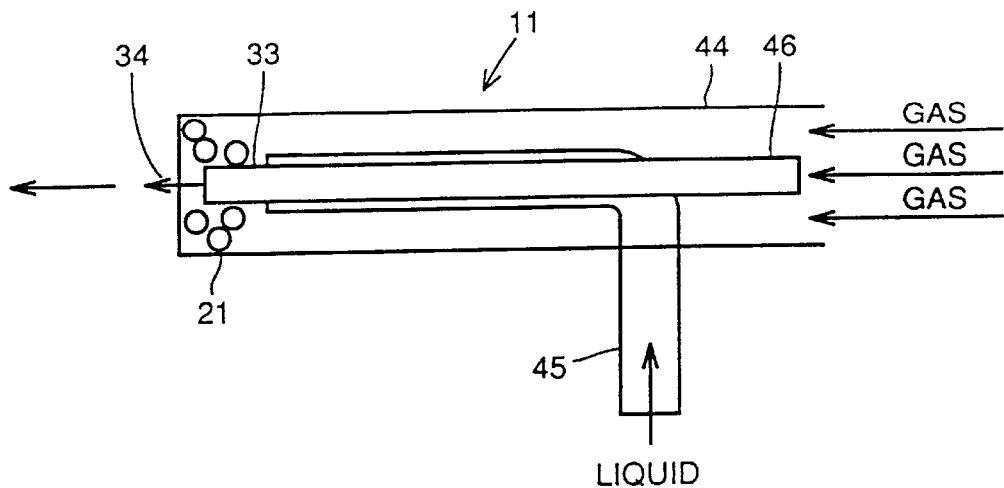
FIG. 14 is a sectional view showing a further specific example of the jet nozzle forming a droplet.
Figure 15:
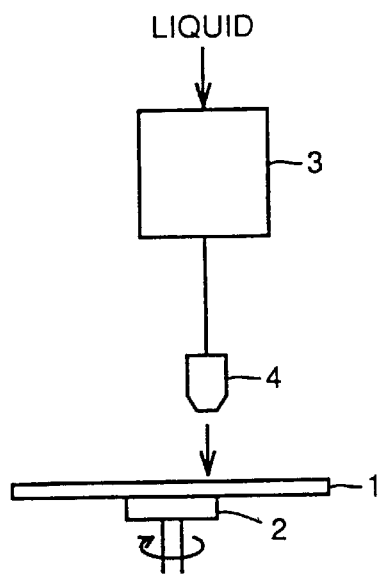
FIG. 15 is a diagram showing a concept of an apparatus implementing conventional high pressure jet water washing.
Figure 16:
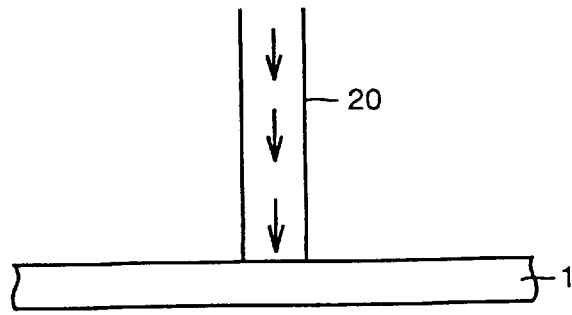
FIG. 16 is a sectional view of a liquid jetted out from the conventional high pressure jet water washing apparatus.
Figure 17:
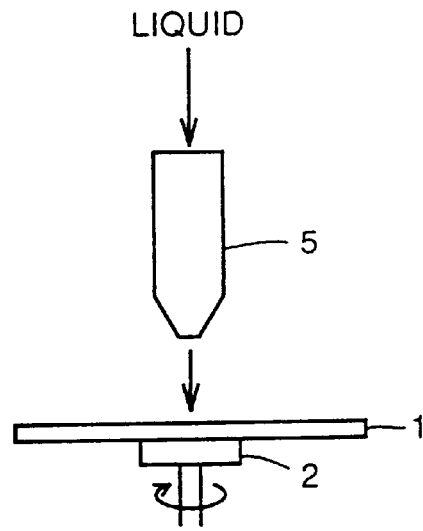
FIG. 17 is a schematic diagram showing an apparatus implementing conventional mega sonic running water washing.
Figure 18:
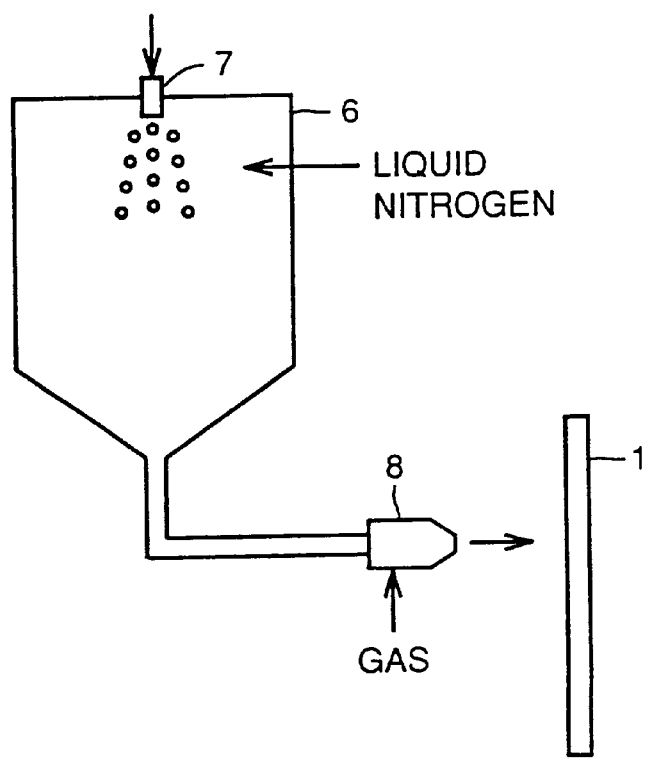
FIG. 18 is a schematic diagram showing an apparatus implementing conventional ice scrubber washing.

FIG. 14 is a sectional view of a jet nozzle according to Embodiment 8. Jet nozzle 11 includes a first flow line 44. Jet nozzle 11 includes a second flow line 45 whose tip extends from the outside of first flow line 44 through a sidewall of first flow line 44 into first flow line 44. The tip portion of second flow line 45 extends in the same direction as first flow line 44. Jet nozzle 11 includes a third flow line 46 whose tip extends from the outside of second flow line 45 through a sidewall of second flow line 45 into second flow line 45. The tip portion of third flow line 46 extends in the same direction as second flow line 45. The tip portion of third flow line 46 extends in excess of the tip portion of second flow line 45. A liquid is supplied in second flow line 45. A gas is supplied in first flow line 44 and third flow line 46. According to this jet nozzle 11, droplets 21 jetted out are removed from substrate 1 by a gas 34 jetted out from third flow line 46 immediately after collision with substrate 1. As a result, there is no liquid on substrate 1 at the moment droplets 21 collide with substrate 1. Consequently, a foreign matter can be removed efficiently.

As described above, in the washing apparatus according to the one aspect of the present invention, a mixing device mixing a liquid and a gas and changing the liquid into droplets is provided in a jet nozzle. Therefore, droplets can be formed easily. As a result, a contamination on a substrate can be removed with the droplets, and the washing effect is improved.

In the washing apparatus according to the another aspect of the present invention, chemicals can be supplied onto a substrate, so that the bond between the substrate and a contamination can be loosened. After that, the contamination is removed with droplets of pure water, whereby the contamination on the substrate can be removed effectively.

In the washing apparatus according to the still another aspect of the present invention, a pure water supply device having a first open/close valve and a chemicals supply device having a second open/close valve are connected to a jet nozzle. Therefore, by switching the valves, droplets of the pure water and droplets of the chemicals can be formed selectively. As a result, only by switching the valves, droplets of the chemicals can be supplied to the surface of a substrate, and then, the droplets of the pure water can be supplied to the surface of the substrate. Consequently, a contamination on the substrate can be removed effectively.

In the washing method according to the further aspect of the present invention, a contamination on a substrate is removed with droplets. Therefore, the contamination adhering onto the substrate can be removed without damaging the surface of the substrate.

In the washing method according to the further aspect of the present invention, the surface of a substrate is first washed with a washing solution. After that, droplets of pure water are jetted out to the surface of the substrate, whereby a contamination on the substrate can be effectively removed.

In the washing method according to the further aspect of the present invention, droplets of a washing solution are prepared, and the droplets are jetted out onto a substrate. As a result, a contamination on the substrate can be removed effectively.

In the washing method according to the further aspect of the present invention, droplets of a washing solution are first jetted out onto a substrate, and then droplets of pure water are jetted out. Since droplets of the washing solution are jetted out onto the substrate, the bond between the substrate and a contamination is loosened. By jetting out droplets of the pure water onto the substrate after that, the contamination on the substrate can be removed effectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for removing a contamination adhering onto a surface of a semiconductor substrate, comprising the steps of:

directing an outlet of a jet nozzle toward a semiconductor substrate;

supplying a liquid to said jet nozzle;

supplying a gas to said jet nozzle;

mixing said liquid and said gas in said jet nozzle to form a droplet of the liquid; and jetting out said droplet toward the surface of said semiconductor substrate with the sonic velocity to remove said contamination; wherein liquid and gas supply pressures are set so that the grain size of said droplet is 1 $\mu$m to 100 $\mu$m.

2. The method of claim 1, wherein a pressure with which said liquid is supplied to said jet nozzle and a pressure with which said gas is supplied to said jet nozzle are matched to each other so that the speed at which said droplet is jetted out is the sonic velocity.

3. The method of claim 1, wherein an angle at which said droplet collides with said substrate is controlled to be 15° to 90°.

4. The method of claim 1, wherein a liquid having a larger density than the pure water is used as said liquid.

5. A method of washing a surface of a semiconductor substrate with washing solution, the method comprising:

forming a droplet of pure water; and jetting out said droplet toward the surface of said semiconductor substrate with the sonic velocity to wash the surface of the semiconductor substrate; wherein the grain size of said droplet is 1 $\mu$m to 100 $\mu$m.

6. A washing method, comprising the steps of:

preparing a semiconductor substrate;

forming a droplet of washing solution; and jetting out said droplet toward a surface of said semiconductor substrate with the sonic velocity to wash the surface of the semiconductor substrate; wherein the grain size of said droplet is 1 $\mu$m to 100 $\mu$m.

7. A washing method, comprising the steps of:

preparing a semiconductor substrate;

forming a droplet of washing solution;

forming a droplet of pure water;

jetting out said droplet of the washing solution toward a surface of said semiconductor substrate with the sonic velocity; and subsequently jetting out of said droplet of said pure water toward a surface of said semiconductor substrate with the sonic velocity to wash the surface of the semiconductor substrate; wherein the grain size of said droplet is 1 $\mu$m to 100 $\mu$m.

* * * * *